(12) United States Patent
Jamali et al.

(10) Patent No.: US 12,316,342 B2
(45) Date of Patent: May 27, 2025

(54) PRODUCT AUTOENCODER FOR ERROR-CORRECTING VIA SUB-STAGE PROCESSING

(71) Applicant: Samsung Electronics Co., Ltd., Suwon-si (KR)

(72) Inventors: Mohammad Vahid Jamali, Ann Arbor, MI (US); Hamid Saber, San Diego, CA (US); Homayoon Hatami, San Diego, CA (US); Jung Hyun Bae, San Diego, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 0 days.

(21) Appl. No.: 17/942,064

(22) Filed: Sep. 9, 2022

(65) Prior Publication Data

US 2023/0104143 A1    Apr. 6, 2023

Related U.S. Application Data

(60) Provisional application No. 63/252,027, filed on Oct. 4, 2021.

(51) Int. Cl.
*H03M 13/09* (2006.01)
*G06N 3/08* (2023.01)

(52) U.S. Cl.
CPC .............. *H03M 13/09* (2013.01); *G06N 3/08* (2013.01)

(58) Field of Classification Search
CPC .................. G06N 3/08; H03M 13/2918
See application file for complete search history.

(56) References Cited

U.S. PATENT DOCUMENTS

| 4,665,537 A | * | 5/1987 | Moriyama | ........ H03M 13/2915 714/755 |
| 4,670,881 A | * | 6/1987 | Imoto | ................ G11B 20/1809 |

(Continued)

FOREIGN PATENT DOCUMENTS

WO    WO 2021/205066 A1    10/2021

*Primary Examiner* — Joseph D Torres
(74) *Attorney, Agent, or Firm* — Lewis Roca Rothgerber Christie LLP

(57) ABSTRACT

A processing circuit implements: an encoder configured to: supply k symbols of original data to a neural product encoder including M neural encoder stages, a j-th neural encoder stage including a j-th neural network configured by j-th parameters to implement an $(n_j, k_j)$ error correction code (ECC), where $n_j$ is a factor of n and $k_j$ is a factor of k; and output n symbols representing the k symbols of original data encoded by an error correcting code; or a decoder configured to supply n symbols of a received message to a neural product decoder including neural decoder stages grouped into a l pipeline stages, an i-th pipeline stage of the neural product decoder including M neural decoder stages, a j-th neural decoder stage comprising a j-th neural network configured by j-th parameters to implement an $(n_j, k_j)$ ECC; and output k symbols decoded from the n symbols of the received message.

15 Claims, 11 Drawing Sheets

(56) References Cited

U.S. PATENT DOCUMENTS

| | | | |
|---|---|---|---|
| 6,581,178 B1* | 6/2003 | Kondo | H03M 13/15 |
| | | | 714/758 |
| 6,625,775 B1* | 9/2003 | Kim | H03M 13/1515 |
| | | | 714/755 |
| 8,977,942 B2* | 3/2015 | Wu | H03M 13/2927 |
| | | | 714/755 |
| 10,516,418 B2* | 12/2019 | Heo | H03M 13/098 |
| 11,232,154 B2 | 1/2022 | Guo et al. | |
| 11,308,385 B2 | 4/2022 | Abadi et al. | |
| 2001/0050622 A1* | 12/2001 | Hewitt | H03M 13/2921 |
| | | | 341/50 |
| 2005/0273688 A1* | 12/2005 | Argon | H04L 1/0071 |
| | | | 714/755 |
| 2006/0190271 A1* | 8/2006 | Kim | H03M 13/29 |
| | | | 714/6.12 |
| 2015/0039963 A1* | 2/2015 | Fonseka | H03M 13/2742 |
| | | | 714/755 |
| 2016/0049964 A1* | 2/2016 | Mateosky | H03M 13/2909 |
| | | | 714/755 |
| 2021/0125107 A1 | 4/2021 | Condessa et al. | |
| 2021/0351863 A1 | 11/2021 | Gunduz | |
| 2021/0407146 A1 | 12/2021 | Jiang et al. | |
| 2022/0092411 A1 | 3/2022 | Shin et al. | |
| 2023/0079744 A1* | 3/2023 | Cavatassi | G06N 3/02 |
| | | | 706/21 |

\* cited by examiner

PRODUCT AUTOENCODER FOR ERROR-CORRECTING VIA SUB-STAGE PROCESSING

CROSS-REFERENCE TO RELATED APPLICATION(S)

This application claims priority to and the benefit of U.S. Provisional Patent Application No. 63/252,027, filed in the United States Patent and Trademark Office on Oct. 4, 2021, the entire disclosure of which is incorporated by reference herein.

FIELD

Aspects of embodiments of the present disclosure relate to channel encoders and decoders implemented using trained neural networks.

BACKGROUND

Channel encoders and decoders improve the reliability of communication systems when transmitting and receiving data over a noisy communication channel. Generally, an encoder implementing an error correction code (or error correcting code ECC) takes an original message as input and generates an encoded message, where the encoded message has some additional bits of data in comparison to the original message (e.g., the encoded message is longer than the original message). These additional bits of data provide redundancy such that, if the encoded message is corrupted or otherwise modified between being transmitted from an encoder and being received at a decoder, the decoder can use the additional data to reconstruct the original message, within some limits on the number of errors that can be corrected in accordance with the ECC that is applied to the original message. Examples of classical error correction codes include Reed-Solomon codes, Turbo codes, low-density parity-check (LDPC) codes, and polar codes.

The above information disclosed in this Background section is only for enhancement of understanding of the present disclosure, and therefore it may contain information that does not form the prior art that is already known to a person of ordinary skill in the art.

SUMMARY

Aspects of embodiments of the present disclosure relate to systems and methods for implementing channel encoders and channel decoders using neural networks and systems and methods for training neural networks to implement such channel encoders and channel decoders.

According to one embodiment of the present disclosure, a processing circuit implements an encoder for an (n,k) error correction code, the encoder being configured to: receive k symbols of original data; supply the k symbols of original data to a neural product encoder including a plurality of M neural encoder stages, a j-th neural encoder stage of the plurality of M neural encoder stages including a j-th neural network configured by a j-th plurality of parameters to implement an $(n_j,k_j)$ error correction code, where $n_j$ is a factor of n and $k_j$ is a factor of k; and output n symbols of encoded data representing the k symbols of original data encoded by an error correcting code.

The j-th neural network may include a fully connected neural network, and the j-th plurality of parameters may include a plurality of weights of connections between neurons of the fully connected neural network.

The encoder may be further configured to reshape the k symbols of original data into a M-dimensional original data, and the j-th neural encoder stage may be configured to encode a j-th dimension of $k_j$ symbols of the M-dimensional original data.

The j-th neural network may be configured to output a real-valued vector having length $n_j$.

The processing circuit may be integrated into a mobile device, and the processing circuit may be configured to encode the original data for transmission in accordance with a cellular communication protocol.

According to one embodiment of the present disclosure, a processing circuit implements a decoder for an (n,k) error correction code, the decoder being configured to: receive n symbols of a received message; supply the n symbols of the received message to a neural product decoder including a plurality of neural decoder stages grouped into a plurality of l pipeline stages, an i-th pipeline stage of the neural product decoder including a plurality of M neural decoder stages, a j-th neural decoder stage of the plurality of M neural decoder stages including a j-th neural network configured by a j-th plurality of parameters to implement an $(n_j,k_j)$ error correction code, where $n_j$ is a factor of n and $k_j$ is a factor of k; and output k symbols of estimated original data decoded from the n symbols of the received message.

The j-th neural network may include a fully connected neural network, and the j-th plurality of parameters may include a plurality of weights of connections between neurons of the fully connected neural network.

The decoder may be further configured to reshape the n symbols of the received message into a M-dimensional received data, and the j-th neural decoder stage may be configured to decode a j-th dimension of $n_j$ symbols of the M-dimensional received data.

The j-th neural network may be configured to output a real-valued vector having length $n_j$.

The j-th neural network may be configured to output a real-valued vector having length $Fn_j$, where F is an integer greater than 1.

The decoder may be configured to supply the n symbols of the received message to at least two of the plurality of neural decoder stages of the neural product decoder.

The processing circuit may be integrated into a mobile device, and the processing circuit may be configured to decode the received data, where the received data is encoded in accordance with a cellular communication protocol.

The number of pipeline stages l may be greater than 1.

According to one embodiment of the present disclosure, a method for jointly training a neural product coding system includes: initializing a plurality of parameters of a plurality of neural encoder stages of a neural product encoder and a plurality of parameters of a plurality of neural decoder stages of a neural product decoder; iteratively alternating between: training the parameters of the neural decoder stages while keeping the plurality of parameters of the neural encoder stages fixed; training the parameters of the neural encoder stages while keeping the plurality of parameters of the neural decoder stages fixed; and outputting trained parameters of the plurality of neural encoder stages of the neural product encoder and trained parameters of the plurality of neural decoder stages of the neural product decoder.

An iteration of training the parameters of the neural encoder stages may include: sending a batch of training sequences to the plurality of neural encoder stages configured with the parameters of the neural encoder stages to compute real-valued codewords; modifying the real-valued codewords based on channel characteristics to compute received codewords; decoding the received codewords using the neural decoder stages configured with the parameters of the neural decoder stages to compute estimated sequences; and updating the parameters of the neural encoder stages based on loss values computed based on the training sequences and the estimated sequences.

A j-th neural encoder stage of the neural encoder stages may include a neural network, and a j-th plurality of parameters of the parameters of the neural encoder stages may include a plurality of weights of connections between neurons of the neural network.

An iteration of training the parameters of the neural decoder stages may include: sending a batch of training sequences to the plurality of neural encoder stages configured with the parameters of the neural encoder stages to compute real-valued codewords; modifying the real-valued codewords based on channel characteristics to compute received codewords; decoding the received codewords using the neural decoder stages configured with the parameters of the neural decoder stages to compute estimated sequences; and updating the parameters of the neural decoder stages based on loss values computed based on the training sequences and the estimated sequences.

The neural decoder stages may be grouped into a plurality of l pipeline stages, an i-th pipeline stage of the neural product decoder including a plurality of M neural decoder stages, a j-th neural decoder stage of the plurality of M neural decoder stages includes a neural network, and a j-th plurality of parameters of the parameters of the neural decoder stages may include a plurality of weights of connections between neurons of the neural network.

The modifying the real-valued codewords based on channel characteristics may include: applying additive white Gaussian noise to the real-valued codewords at a range of different signal to noise ratio (SNR) values to compute the received codewords.

The received codewords may be supplied to a plurality of the neural decoder stages.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

Figure 1:
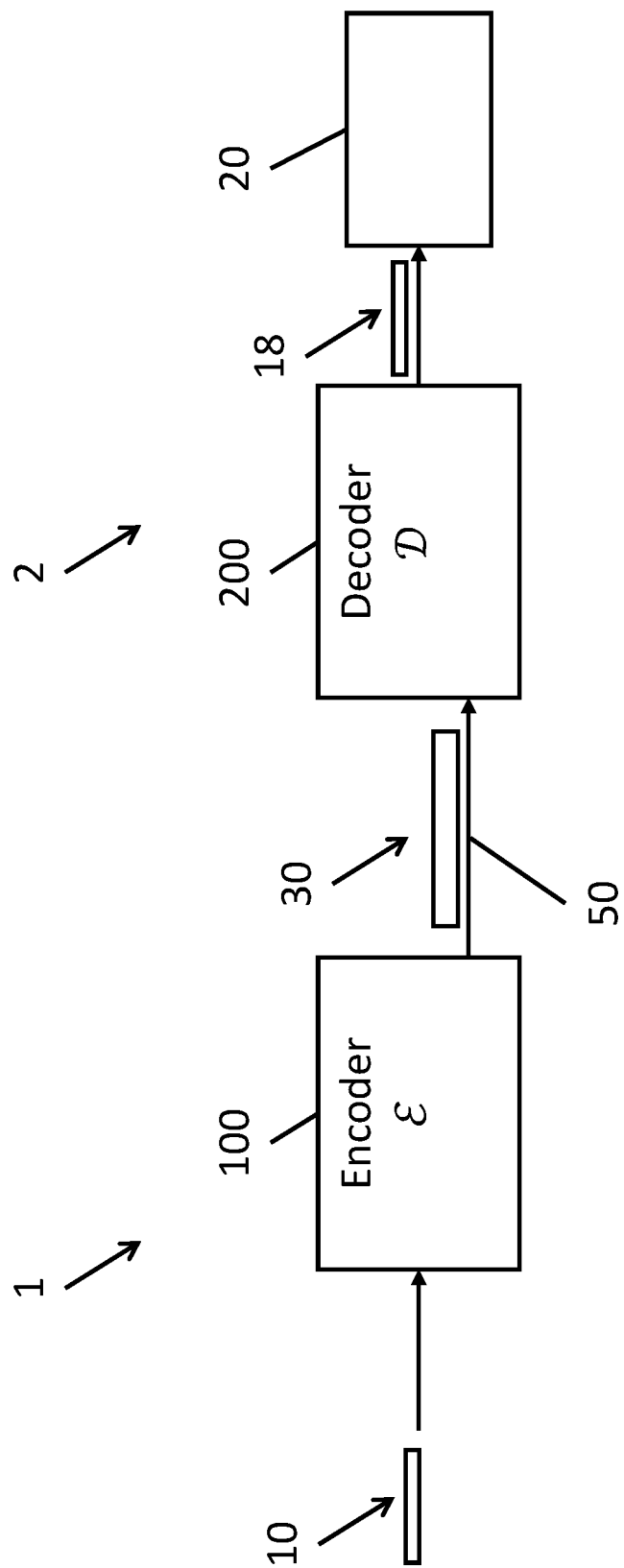
FIG. 1 is a schematic block diagram of a communications link or channel between a sender and a receiver, the sender including an encoder in accordance with embodiments of the present disclosure and the receiver including a decoder in accordance with embodiments of the present disclosure.

In the following detailed description, only certain example embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

Aspects of embodiments of the present invention are directed to implementing channel encoders and channel decoders using neural networks, including neural network architectures for implementing channel encoders, neural network architectures for implementing channel decoders, hardware implementations of channel encoders and channel decoders using such trained neural networks, and systems and methods for applying machine learning techniques for training neural networks to implement channel encoders and channel decoders.

Generally, a channel encoder E maps an input sequence of information bits u having length k to a length-n sequence of coded bits c ($c=\varepsilon(u)$) by adding redundancy to protect the transmission of the information bits across a noisy communication channel. Here, k and n are called the code dimension and block-length, respectively, and the resulting code is denoted by an (n, k) code, where n>k. The code rate R=k/n provides an indication of the efficiency of the code. In the case of additive white Gaussian noise (AWGN) channel, the received length-n sequence is y=c+n, where n is the channel noise vector whose components are Gaussian random variables of mean zero and variance $\sigma^2$. The ratio of the average energy $E_s$ per coded symbol to the noise variance is called the signal-to-noise ratio (SNR): $SNR=E_s/\sigma^2$. A channel decoder $\mathcal{D}$ exploits the added redundancy in the encoder to compute an estimated message û of the original message u based on the noisy codewords y ($\hat{u}=\mathcal{D}(y)$) while trying to minimize the number of errors caused by the channel noise on the messages.

Depending on the amount of channel noise n (e.g., depending on the SNR of the channel) and depending on the characteristics of the code (e.g., the number of errors that can be corrected by the code), the decoder may or may not be able to succeed in correcting all the errors introduced by the channel noise n. The error rate after decoding may be characterized as a bit error rate (BER) indicating the fraction of bits in the block of size k that are erroneous:

$$BER = \frac{1}{k}\sum_{i=1}^{k} Pr(\hat{u}_i \neq u_i)$$

and also as a block error rate (BLER) indicating the probability that the block has any erroneous bits at all:

$$BLER = Pr(\hat{u} \neq u)$$

One technical challenge in deep learning-based design of encoders and decoders is a dimensionality issue that arises in the context of channel coding due to huge code spaces (there are $2^k$ distinct codewords for a message length or binary linear code of dimension k). This is problematic because only a small portion of all possible codewords will be seen by the machine learning model (e.g., a neural network) during training (e.g., presenting all $2^k$ possible codewords during training would be intractable for practical binary linear code dimensions k). Therefore, it was commonly believed that the trained machine learning models for the encoders and decoders would fail to generalize to codewords that were not seen during training and, as noted above, these unseen codewords constitute the vast majority of possible codewords for large values of k (e.g., practical values of k that would be used in modern communication systems). Additionally, it was commonly believed that huge networks with excessively large number of learnable parameters would be needed in order to account for larger code dimensions (e.g., values of k larger than 100 information bits) and that it was therefore prohibitively complex, if not impossible, to train neural networks to encode and decode relatively large channel codes. Furthermore, it was commonly believed that jointly training an encoder neural network and a decoder neural network would cause these trained neural networks to settle in unfavorable local optima due to non-convex loss functions, and therefore some approaches relate to only training a decoder neural network for decoding messages that were encoded using an existing, classical error correction code such as Reed-Solomon codes, Turbo codes, low-density parity-check (LDPC) codes, and polar codes.

Aspects of embodiments of the present disclosure demonstrate that it is possible to train neural networks to perform channel encoding and channel decoding for large values of k (e.g., larger than 100 information bits) and that the neural encoder and the neural decoder can be jointly trained.

In more detail, some aspects of embodiments of the present disclosure relate to a product autoencoder architecture for an encoder neural network (or neural encoder) and a decoder neural network (or neural decoder), where the product autoencoder architecture constructs large neural codes using smaller code components or stages. In some embodiments, multiple smaller encoder and decoder neural network components are trained and connected in M stages (where M is a positive integer), the stages having parameters $(n_1, k_1), (n_2, k_2), \ldots, (n_M, k_M)$ such that $n_1 n_2 \ldots n_M = n$ and $k_1 k_2 \ldots k_M = k$.

Aspects of embodiments of the present disclosure further relate to systems and methods for automatically developing novel error correction codes using a machine learning process (instead of through manual theoretical analysis). These machine learning process include applying a deep learning process to the joint training of an encoder neural network and a decoder neural network. The trained encoder neural network and decoder neural network implement an error correcting code that encodes the information supplied as input along with additional redundant information and that can robustly decode the encoded messages in the presence of noise. In some embodiments, these jointly trained novel error correction codes (or neural codes or neural error correction codes) outperform state-of-the-art classical error correction codes (e.g., Turbo Autoencoders, polar codes, and LDPC codes) along performance metrics such as bit error rate.

FIG. 1 is a schematic block diagram of a communications link or channel between a sender 1 and a receiver 2, the sender 1 including an encoder 110 in accordance with embodiments of the present disclosure and the receiver 2 including a decoder 120 in accordance with embodiments of the present disclosure. In the arrangement shown in FIG. 1, original data 10 is to be transmitted from the sender 1 to the receiver 2, where the original data 10 reconstructed by the decoder 120 as decoded data 18. The decoded data 18 may then be consumed by a data consumer 20. In more detail, the encoder 110 encodes the original data 10 into encoded data 130, and the encoded data 130 is transmitted over a communication channel 150 to the decoder 120. The decoder 120 then decodes the encoded data 130 to reconstruct the original data 18.

According to various embodiments of the present disclosure, the encoder 110 and the decoder 120 may, respectively, be referred to as an encoder circuit or encoder processing circuit and a decoder circuit or decoder processing circuit and may be implemented using various processing circuits such as a central processing unit (CPU), an application processor (AP) or application processing unit (APU), a field programmable gate array (FPGA), an application specific integrated circuit (ASIC) such as a display driver integrated circuit (DDIC), and/or a graphics processing unit (GPU) of one or more computing systems. For example, the encoder 110 and the decoder 120 may be components of the same computer system (e.g., integrated within a single enclosure, such as in the case of a smartphone or other mobile device, tablet computer, or laptop computer), may be separate components of a computer system (e.g., a desktop computer in communication with an external monitor), or may be separate computer systems (e.g., two independent computer systems communicating over the communication channel 150), or variations thereof (e.g., implemented within special purpose processing circuits such as microcontrollers configured to communicate over the communication channel 150, where the microcontrollers are peripherals within a computer system). As would be understood by one of skill in the art, the encoder circuit may be implemented using a different type of processing circuit than the decoder circuit. In addition, as would be understood to one of skill in the art, the various processing circuits may be components of a same integrated circuit (e.g., as being components of a same system on a chip or SoC) or may be components of different integrated circuits that may be connected through pins and lines on a printed circuit board.

As a concrete example, the communication link may be a wireless communication link such as a cellular connection or a local wireless network connection (e.g., Wi-Fi connection) between a client mobile device (e.g., smartphone, laptop, or other user equipment (UE)) and a base station (e.g., gNodeB or gNB in the case of a 5G-NR base station or a Wi-Fi access point or Wi-Fi router), where the devices may transmit and receive data over the communication channel 150 using processing circuits according to the present disclosure integrated into the respective devices, where the data is formatted or encoded and decoded in accordance with a communication protocol (e.g., a cellular communication protocol such as 6G wireless or a wireless networking communication protocol such as a protocol in the IEEE 802.11 family of protocols).

Figure 2:
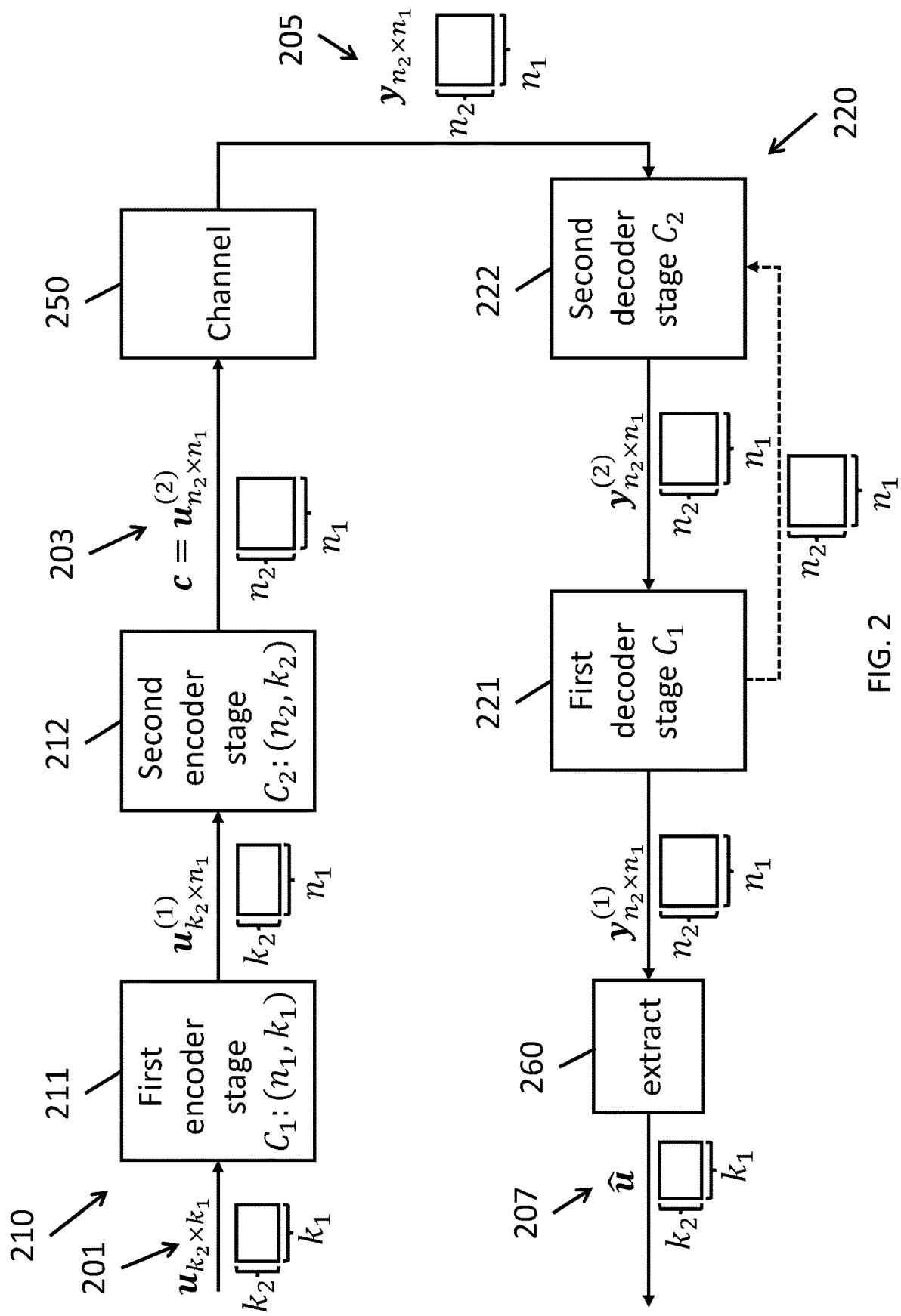
FIG. 2 is a schematic depiction of the use of a two-dimensional product code in a communication system including an encoder that includes a first encoder stage and a second encoder stage and a decoder that includes a second decoder stage and a first decoder stage.

FIG. 2 is a schematic depiction of the use of a two-dimensional product code in a communication system including an encoder that includes a first encoder stage and a second encoder stage and a decoder that includes a second decoder stage and a first decoder stage.

A product code structure or architecture allows a large error correction code or channel code to be constructed from smaller components or stages. FIG. 2 presents an example of a two-dimensional (n, k) product code, including a product encoder 210 to encode an input k-bit codeword u 201 into n-bit encoded messages c 203 and a product decoder 220 to decode a received n-bit message y 205 to recover estimated message û 207. In particular, the two-dimensional (n, k) product code is constructed from two smaller codes: $C_1$: ($n_1$, $k_1$) and $C_2$: ($n_2$, $k_2$), where $n=n_1 n_2$ and $k=k_1 k_2$. As shown in FIG. 2, the product encoder 210 includes a first encoder stage 211 that implements the ($n_1$, $k_1$) code $C_1$, and a second encoder stage 212 that implements the ($n_2$, $k_2$) code $C_2$. More generally, an i-th stage implements a code $C_i$: ($n_i$, $k_i$) where $n_i$ is a factor of n and $k_i$ is a factor of k. Likewise, the product decoder 220 includes a first decoder stage 221 that implements the code $C_1$, and a second decoder stage 222 that implements the code $C_2$.

As noted above, $k=k_1 k_2$ and therefore the k-bit input codeword u can be reshaped into a $k_2 \times k_1$ matrix. Because each row of the matrix has $k_1$ symbols, the first encoder stage 211 applies the ($n_1$, $k_1$) code $C_1$ independently to each of the $k_2$ rows of the input to generate a $k_2 \times n_1$ matrix $u^{(1)}$. This first intermediate encoded message $u^{(1)}$ is supplied to the second encoder stage 212. Here, because each column of the first intermediate encoded message $u^{(1)}$ has $k_2$ symbols, the second encoder stage 212 applies the ($n_2$, $k_2$) code $C_2$ independently to each column to generate an $n_2 \times n_1$ output matrix $u^{(2)}$. Because this is a two-dimensional product code, there are no further stages in this pipeline of encoder stages, and this $n_2 \times n_1$ output matrix $u^{(2)}$ is the length n coded message to be transmitted on a channel 250.

Noise and other interference in the channel 250 can modify the data in the message such that the product decoder 220 receives a message y that may differ from the message output by the product encoder 210.

As shown in FIG. 2, the product decoder 220 includes an encoder pipeline that includes a first decoder stage 221 and a second decoder stage 222 that decode the message in the reverse order in which the encoder applied the codes $C_1$ and $C_2$. In the example shown in FIG. 2, in the product encoder 210 pipeline, the first encoder stage 211 applied code $C_1$ and then the second encoder stage 212 applied code $C_2$. Accordingly, the product decoder 220 has a decoder pipeline that first applies the second decoder stage for code $C_2$ (e.g., to decode each column of $n_2$ symbols) and then applies the first decoder stage for code $C_1$ (e.g., to decode each row of $n_1$ symbols).

In the example shown in FIG. 2, applying the decoder stages does not change the shape of the data. For example, applying the second decoder stage 222 to the columns of the $n_2 \times n_1$ input results in an $n_2 \times n_1$ second intermediate decoder output $y_{n_2 \times n_1}^{(2)}$ and applying the first decoder stage 221 to the rows of the second intermediate decoder output $y_{n_2 \times n_1}^{(2)}$ produces a first intermediate decoder output $y_{n_2 \times n_1}^{(1)}$ having dimensions $n_2 \times n_1$. As such, an extraction circuit 260 may be used to extract a length k sequence (e.g., $k_2 \times k_1$ matrix) from the first intermediate decoder output $y_{n_2 \times n_1}^{(1)}$.

In addition, in some circumstances, decoding performance can be improved by applying a soft-input soft-output (SISO) decoder and also applying several iterations, where the output of the product decoder (e.g., the output of the last decoder stage, in this case the first decoder stage 221 as shown in FIG. 2) is fed back as input to the product decoder 220 (e.g., the input to the second decoder stage 222 as shown in FIG. 2) for some set number of iterations (I iterations) before extracting the estimated message û from the output of the product decoder 220. These iterations can improve the decoding performance because, in some circumstances, errors that were not corrected during a row decoding might be corrected in a later column decoding (or vice versa) or after several iterations (e.g., reconstructing some lost data may enable other, previously not reconstructable, lost data to be subsequently reconstructed).

While the above discussion of FIG. 2 relates to a two-dimensional code, product codes are not limited thereto and can also be applied to M-dimensional product codes having parameters (n, k, d) that uses M binary linear block codes $C_1$, $C_2$, ..., $C_M$. Here, each l-th encoder encodes the l-th dimension of the M-dim input matrix, and each l-th decoder decodes the vectors on the l-th dimension of the M-dim output matrix. In each code (e.g., an l-th code $C_l$:($n_l$, $k_l$, $d_l$)) with generator matrix $G_l$ for l=1, 2, ..., M, the parameters of the resulting product code are:

Block-length: $n=\Pi_{l=1}^{M} n_l$
Dimension: $k=\Pi_{l=1}^{M} k_l$
Rate: $R=\Pi_{l=1}^{M} R_l$
Minimum distance: $d=\Pi_{l=1}^{M} d_l$
Generator matrix: $G=G_1 \otimes G_2 \otimes \ldots \otimes G_M$ Aspects of embodiments of the present disclosure build upon product codes by implementing each stage of a product encoder and each stage of a product decoder as a separate neural network. These neural networks may be referred to as neural encoder stages and neural decoder stages, respectively. In addition, in some embodiments of the present disclosure, the I iterations performed by the product decoder are unrolled into a decoder pipeline of M×I separate neural decoder stages (e.g., M×I separate neural networks) grouped into I groups or pipeline stages or sub-pipelines of M neural decoder stages.

Some examples of the present disclosure will be described in more detail below in the context of two-dimensional product codes (where M=2). While embodiments of the present disclosure are not limited to cases where M=2 and can also include embodiments where M>2, in some practical use cases, M=2 represents a good tradeoff between complexity and performance.

The process of training a neural encoder and neural decoder pair generally includes of two main steps: (1) a decoder training schedule; and (2) encoder training schedule. More specifically, during each training epoch, the neural decoder stages are trained (e.g., end-to-end) several times while keeping the neural encoder stages fixed, and then the neural encoder stages are trained multiple times while keeping the neural decoder stages unchanged. In some alternative embodiments, the training process starts with the neural encoder stages, followed by training the neural decoder stages. In the following, the encoder architecture and its training schedule will be described first, followed by the decoder architecture and its training schedule.

Figure 3A:
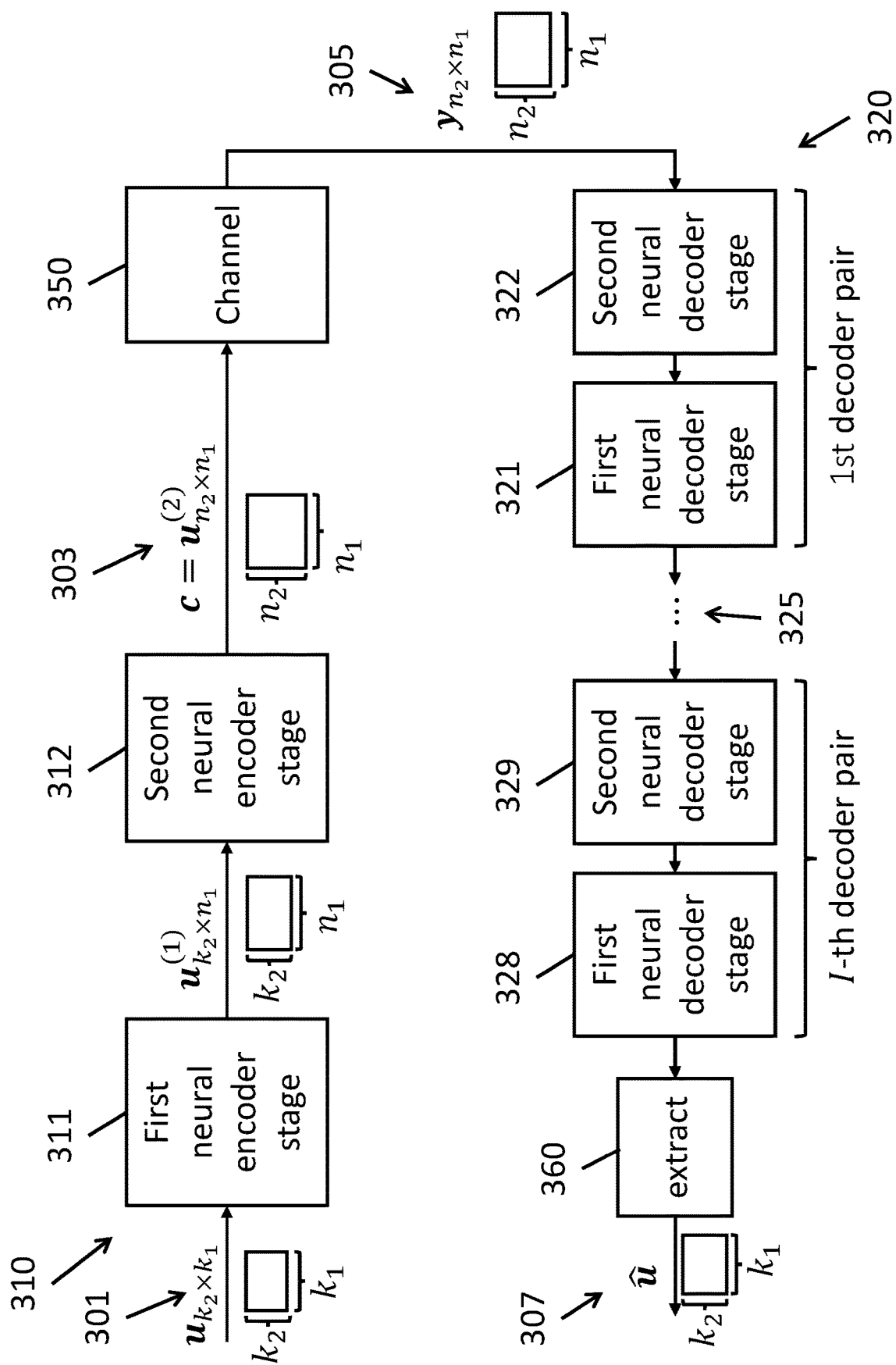
FIG. 3A is a schematic depiction of a two-dimensional product code in a communication system, including a neural product encoder and a neural product decoder according to one embodiment of the present disclosure.

FIG. 3A is a schematic depiction of a two-dimensional product code in a communication system, including a neural product encoder and a neural product decoder according to one embodiment of the present disclosure. The neural product encoder and the neural product decoder are typically implemented on different communication devices of the communication system and that communicate with one another over a communication channel. For example, the neural product encoder may be implemented in user equipment such as a smartphone and the neural product decoder may be implemented in a base station. In many cases, these communication devices are transceivers that can both transmit and receive data. For example, a smartphone may include both a neural product encoder and a neural product decoder for transmitting and receiving data, respectively, where these may implement the same neural codes (e.g., same error correction codes) or different neural codes (e.g., different error correction codes).

In various embodiments, a neural product encoder and a neural product decoder may be implemented by processing circuits of a communication device. Examples of processing circuits include, but are not limited to, a general-purpose processor core (e.g., included within application processors, system-on-chip processors, and the like), a field programmable gate array (FPGA which may include a general-purpose processor core), an application specific integrated circuit (ASIC), a digital signal processor (DSP), a neural accelerator or neural processing unit, and combinations thereof (e.g., controlling an overall encoding or decoding process using a general-purpose processor core that controls a neural accelerator to perform neural network operations such as vector multiplications and accumulations and to apply non-linear activation functions). The neural product encoder and the neural product decoder may be defined in accordance with an architecture and a plurality of parameters such as weights and biases of connections between neurons of different layers of the neural networks of various neural stages of the neural product encoder and the neural product decoder. In some embodiments of the present disclosure, these parameters may be stored in memory and accessed by the processing circuits during runtime to perform computations implementing the neural stages. In some embodiments of the present disclosure, the processing circuit is configured with these parameters (e.g., fixed in a lookup table or as constant values in a special-purpose DSP, ASIC, FPGA, or neural processing unit).

The arrangement of components shown in FIG. 3A are similar to those of FIG. 2, except that the first encoder stage and the second encoder stage of the product encoder and the first decoder stage and the second decoder stage of the product decoder are each replaced with corresponding neural networks, referred to respectively as a first neural encoder stage 311 and a second neural encoder stage 312 of a neural product encoder 310 and a first neural decoder stage 321 and a second neural decoder stage 322 of a neural product decoder 320.

Figure 3B:
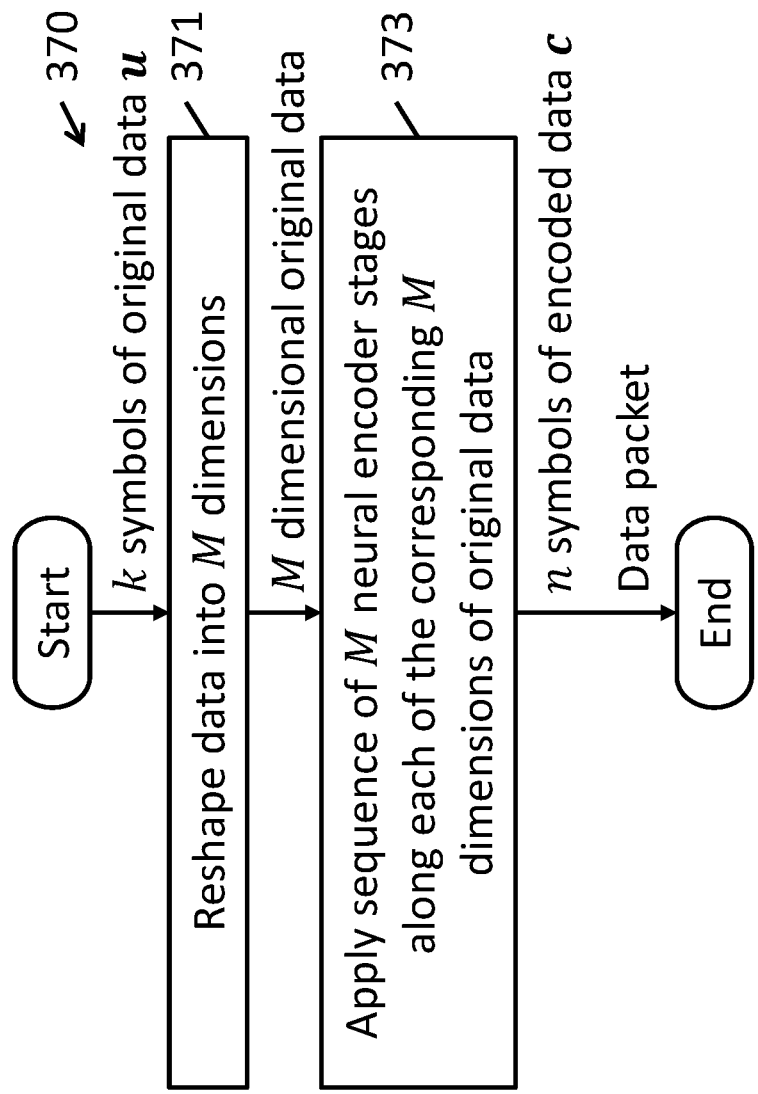
FIG. 3B is a flowchart of a method for encoding data using a neural product encoder according to one embodiment of the present disclosure.

FIG. 3B is a flowchart of a method 370 for encoding data using a neural product encoder according to one embodiment of the present disclosure.

In a manner similar to that described in FIG. 2, the neural product encoder 310 receives an input message of k symbols (e.g., k bits), where $k=k_1 k_2$. At 371, the neural product encoder 310 reshapes the data into an M-dimensional input, e.g., into a $k_2 \times k_1$ two-dimensional array in the current example. In some embodiments, the reshaping is performed implicitly, such as through setting the way data stored in a computer memory is accessed based on indices.

At 373, the neural product encoder 310 applies a pipeline of M neural encoder stages along each of the corresponding M dimensions of the original data to generate encoded data c having a length of n symbols. In the example shown in FIG. 3A, M=2 and therefore the neural product encoder 310 includes a sequence or pipeline of two neural encoder stages: a first neural encoder stage 311 and a second neural encoder stage 312.

The first neural encoder stage 311 is configured to take an input of $k_1$ symbols (e.g., $k_1$ bits) and to produce an output of $n_1$ symbols (e.g., $n_1$ bits). Likewise, the second neural encoder stage is configured to take an input of k symbols (e.g., $k_2$ bits) and to produce an output of $n_2$ symbols (e.g., $n_2$ bits). Accordingly, the first neural encoder stage 311 can operate on the input on a row-by-row basis to generate a $k_2 \times n_1$ matrix $u^{(1)}$, and this first intermediate encoded message $u^{(1)}$ is supplied to the second neural encoder stage 312. Here, because each column of the first intermediate encoded message $u^{(1)}$ has $k_2$ symbols, the second neural encoder stage 312 operates on each column independently to generate an $n_2 \times n_1$ output matrix $u^{(2)}$. Because this is a two-dimensional product code, there are no further stages, and this $n_2 \times n_1$ output matrix $u^{(2)}$ represents the length n coded message c to be transmitted on a channel 350 (e.g., as a data packet). For example, in some embodiments, the real-valued $n_2 \times n_1$ output matrix $u^{(2)}$ is reshaped into a length n coded message c and binarized (e.g., converted into binary values) or otherwise discretized into discrete values. In a practical coding system, the length n coded message c is typically also modulated, by a transmitter device, in accordance with a modulation method associated with a physical layer protocol (e.g., various protocols for wireless communication, wired electrical communication, wired optical communication, etc.).

The channel 350 may distort the length n coded message c, such that the neural product decoder 320 receives a length n received coded message y that may differ from the length n coded message c (e.g., where differences between the received message y and the transmitted coded message c may be referred to as errors or erasures).

As shown in FIG. 3A, the neural product decoder 320 is substantially similar to the product decoder 220 shown in FIG. 2, except that the decoder stages are implemented using neural decoders (e.g., trained neural networks, as discussed in more detail below), and the I iterations of the product decoder stages shown in FIG. 2 are unrolled into I separate decoder pairs. The received message y may be demodulated from an analog signal received by a receiver device in a communication system.

Figure 3C:
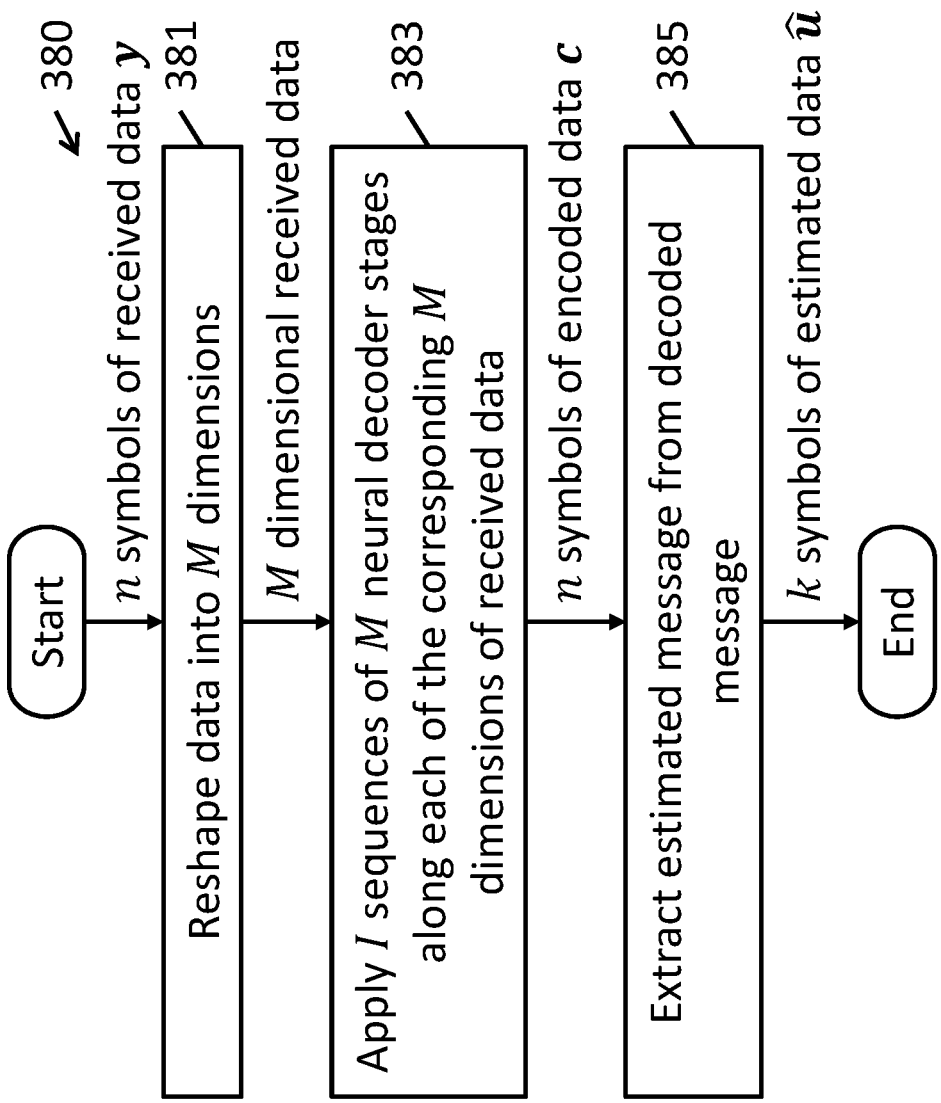
FIG. 3C is a flowchart of a method for decoding data using a neural product decoder according to one embodiment of the present disclosure.

FIG. 3C is a flowchart of a method 380 for decoding data using a neural product decoder according to one embodiment of the present disclosure. At 381, the neural product decoder 320 reshapes the received coded message y into an M-dimensional input, e.g., into a $n_2 \times n_1$ two-dimensional array in the current example. In some embodiments, the reshaping is performed implicitly, such as through setting the way data stored in a computer memory is accessed based on indices. At 381, the neural product decoder 320 applies a plurality of sequences (e.g., I sequences) of M neural decoder stages, where each of the M neural decoder stages operates along a corresponding one of the M dimensions of the received data y. In the particular example shown in FIG. 3A, M=2 and therefore each sequence of M decoders is referred to as a decoder pair.

Each decoder pair includes a first neural decoder stage and a second neural decoder stage (e.g., one neural decoder stage for each of the M dimensions of the product code), where each decoder stage is configured to operate along a different dimension of the input data (e.g., where the second neural decoder stage is configured to operate along a column dimension and the first neural decoder stage is configured to operate along a row dimension). For example, the first neural decoder pair shown in FIG. 3A includes a first neural decoder stage 321 configured to operate along a row dimension and a second neural decoder stage 322 configured to operate along a column dimension. Additional intermediate decoder pairs 325 having a similar structure of a second neural decoder stage and a first neural decoder stage operating on corresponding dimensions of the data are placed in sequence downstream of the first decoder pair, where the output of the final intermediate decoder pair of the additional intermediate decoder pairs 325 is supplied to an I-th decoder pair which includes a corresponding first neural decoder stage 328 and a second neural decoder stage 329. Accordingly, instead of looping through the same decoder stages I times as shown in FIG. 2, FIG. 3A shows an implementation of a neural decoder stage in which the loop is unrolled into I separate decoder stages.

The output of the last neural decoder pair (the I-th decoder pair) is supplied to an extraction circuit 360 to extract the k message symbols at 385 therefrom to produce the output length k estimated message û 307.

As noted above, FIG. 3A shows an example embodiment making use of a two-dimensional product code (e.g., where M=2), but embodiments of the present disclosure are not limited thereto and also include embodiments here M>2. In such embodiments, the neural product encoder 310 would include M neural encoder stages (e.g., M separate neural networks) and each of the I neural decoder pairs of the neural product decoder 320 would instead include sequences of M neural decoders, for a total of I×M separate neural decoder stages in the neural product decoder 320.

Figure 3D:
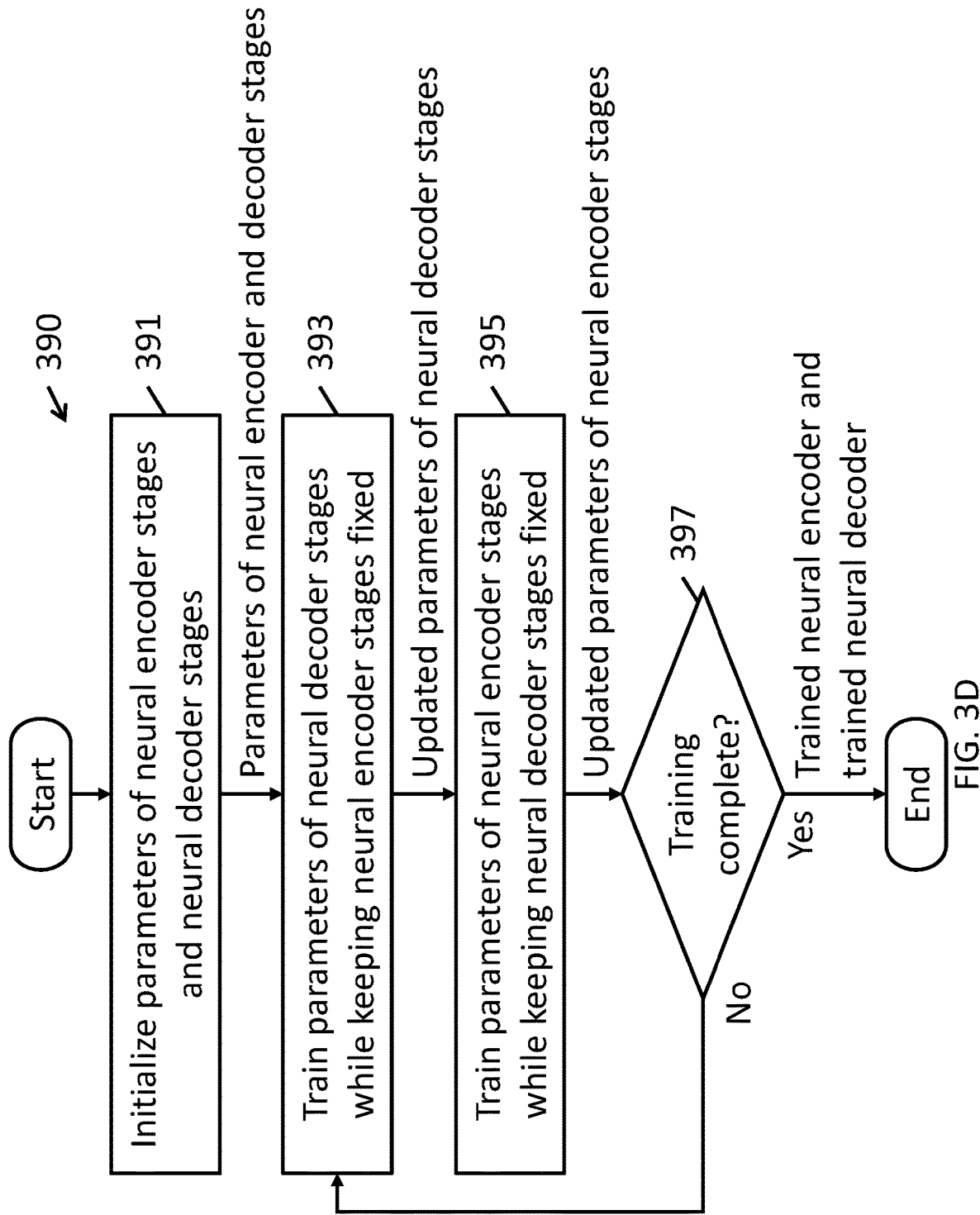
FIG. 3D is a flowchart of a method for jointly training a neural product encoder and a neural product decoder of an encoder-decoder pair according to one embodiment of the present disclosure.

FIG. 3D is a flowchart of a method 390 for jointly training a neural product encoder and a neural product decoder of an encoder-decoder pair according to one embodiment of the present disclosure. The method may be performed by a training system that is implemented, for example, on a computer system including a processor and memory, where the memory stores instructions that, when executed by the processor, cause the processor to perform the operations described herein. The computer system may include multiple processors and multiple memories, such that the training process is distributed across the multiple processors. The multiple processors may be included on a same computing device (e.g., connected to a same bus on a same physical board) and/or may be distributed across multiple computing devices (e.g., multiple computing devices communicating over a computer network).

At 391, the training system initializes parameters of neural encoder stages and neural decoder stages. As noted above, the neural encoder stages and the neural decoder stages include neural networks whose behaviors are specified by parameters (e.g., weights and biases associated with connections between the neurons in different layers of the neural network). In some embodiments of the present disclosure, each of the neural encoder stages and each of the neural decoder stages is a fully connected neural network (FCNN). In some embodiments, the fully connected neural network is a deep neural network having more than one hidden layer ($L_{enc}$>1 hidden layers). Accordingly, in some embodiments of the present disclosure, the training system initializes the parameters of the neural networks of the neural encoder stages and the neural decoder stages. In some embodiments, these parameters may be initialized to random values (e.g., set by a pseudorandom number generator). In some embodiments, the neural encoder stages and the neural decoder stages are initialized using parameter values from previously trained neural networks (e.g., previously trained based on some set of training data).

At 393 and 395, the training system alternates between training the neural encoder and training the neural decoder. In the particular example shown in FIG. 3D, the training system starts with training the neural decoder stages at 393, followed by training the neural encoder stages at 395. For example, at 393 the training system trains or updates the parameters the neural decoder stages of the neural decoder while keeping the parameters of the neural encoder stages fixed. Similarly, at 395 the training system trains or updates the parameters of the neural encoder stages of the neural encoder while keeping the parameters of the neural decoder stages fixed. Details regarding the training schedules for the neural encoder stages and the neural decoder stages will be presented in more detail below with respect to FIGS. 4A, 4B, 5A, and 5B.

At 397, the training system determines if training is complete. In some embodiments the training system tests the performance of the neural encoder and the neural decoder, in accordance with the newly updated parameters. Performance may be measured by supplying input test codewords to the trained network (e.g., in accordance with the method 370 described above with respect to FIG. 3B to compute test encoded message, then distorting the messages (e.g., in accordance with a variety of different signal to noise ratios) and supplying the distorted messages as the received messages as input to the trained neural decoder. The output estimated message of the trained neural decoder is compared to the corresponding input test codeword to evaluate performance metrics such as the bit error rate (BER) and block error rate (BLER) of the trained neural encoder and neural decoder pair. The training system may determine that training is complete based on, for example, performance metrics reaching a particular threshold (e.g., BER and/or BLER below a particular threshold rate) or a flattening of a rate of improvement of the performance metrics (e.g., BER and/or BLER remaining approximately the same between the previous iteration of the training cycle and the current iteration). If training is not complete, then the training system performs another iteration at 393 and 395, where the parameters of the neural decoder and the parameters of the neural encoder are further updated over the course of additional training epochs. When training is complete, the training system outputs the trained neural encoder and trained neural decoder, which may be represented by their corresponding sets of parameters (e.g., weights and biases of connections between neurons of the neural networks of the neural stages).

Figure 4A:
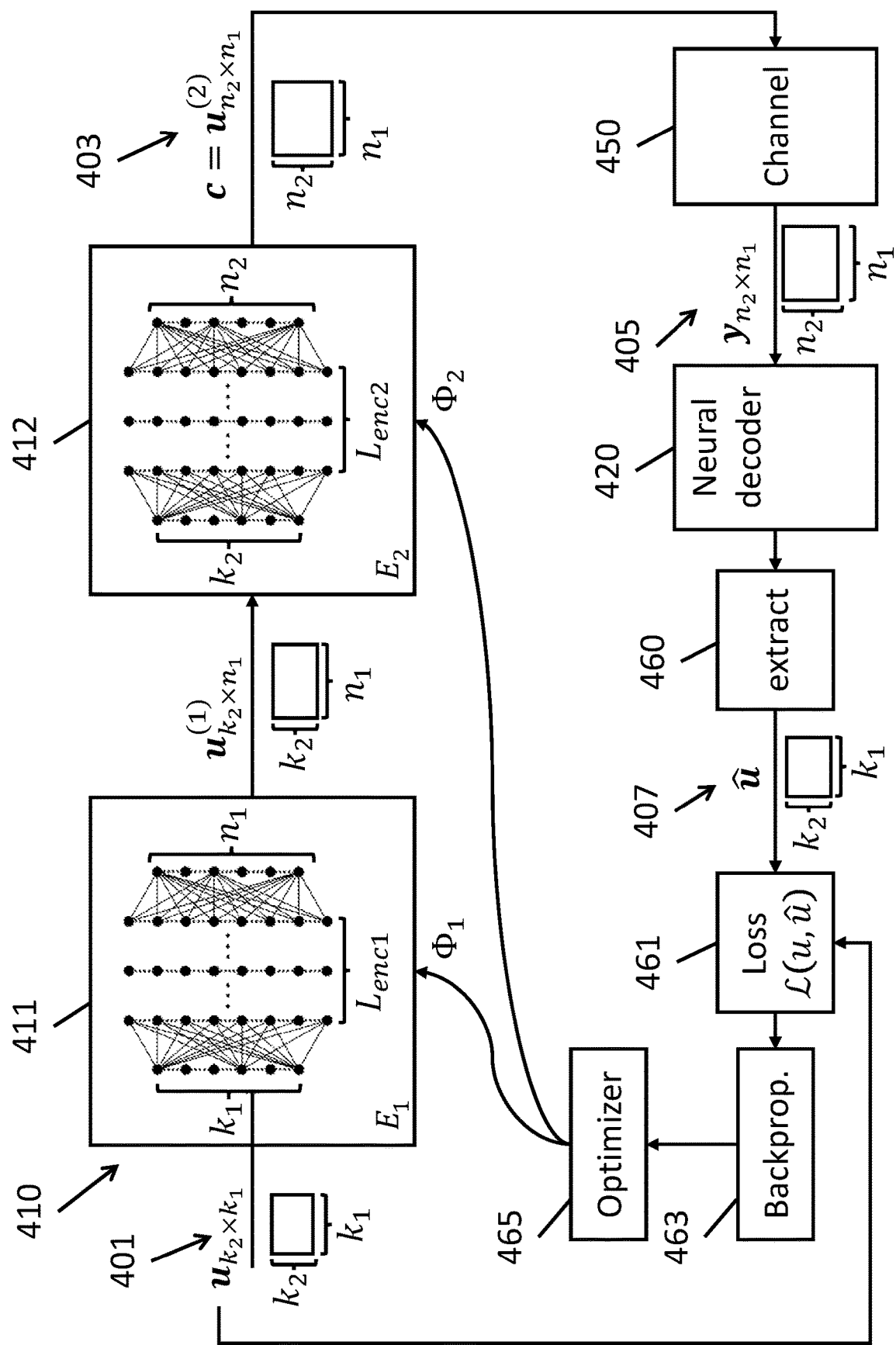
FIG. 4A is a schematic depiction of an encoder training schedule of a joint training process for training a neural product encoder and a neural product decoder pair according to one embodiment of the present disclosure.

FIG. 4A is a schematic depiction of an encoder training schedule of a joint training process for training a neural product encoder and a neural product decoder pair according to one embodiment of the present disclosure.

As shown in FIG. 4A, the first neural encoder stage 411 and the second neural encoder stage 412 of the product encoder are implemented by two corresponding fully connected neural networks (FCNNs), namely $E_1(\phi_1)$ and $E_2(\phi_2)$ each being configured by a corresponding set of parameters $\phi_1$ and $\phi_2$, (e.g., weights and biases). Each j-th encoder, j=1, 2, has an input size of $k_j$, output size of $n_j$, and $L_{enc_j}$ hidden layers of size $N_{enc_j}$. Upon receiving a batch of $k_2 \times k_1$ arrays of information bits, the first neural encoder $E_1$ 411 maps each length-$k_1$ row to a length-$n_1$ real-valued (e.g., a floating point value or a fixed point value that can represent non-integer values such as fractional values in a range between 0 and 1) vector, resulting in a tensor $u_{B \times k_2 \times n_1}^{(1)}$. The second neural encoder stage $E_2$ 412 then maps each real-valued length-$k_2$ vector in the second dimension of $u^{(1)}$ to a length-$n_2$ real-valued vector. In some embodiments, the mappings are nonlinear mappings and therefore the resulting code is a nonlinear and non-binary code.

In some embodiments, in order to ensure that the average power per coded bit is equal to one and thus that the average SNR is equal to a given SNR, the length-n real-valued vector $c=(c_1, c_2, \ldots, c_n)$ of the coded sequence at the output of the encoder as following:

$$c \to c' := \frac{c}{\|c\|_2} \times \sqrt{n}$$

Therefore, $\|c'\mu_2^2 = n$, and thus the average power per coded symbol is equal to one.

Figure 4B:
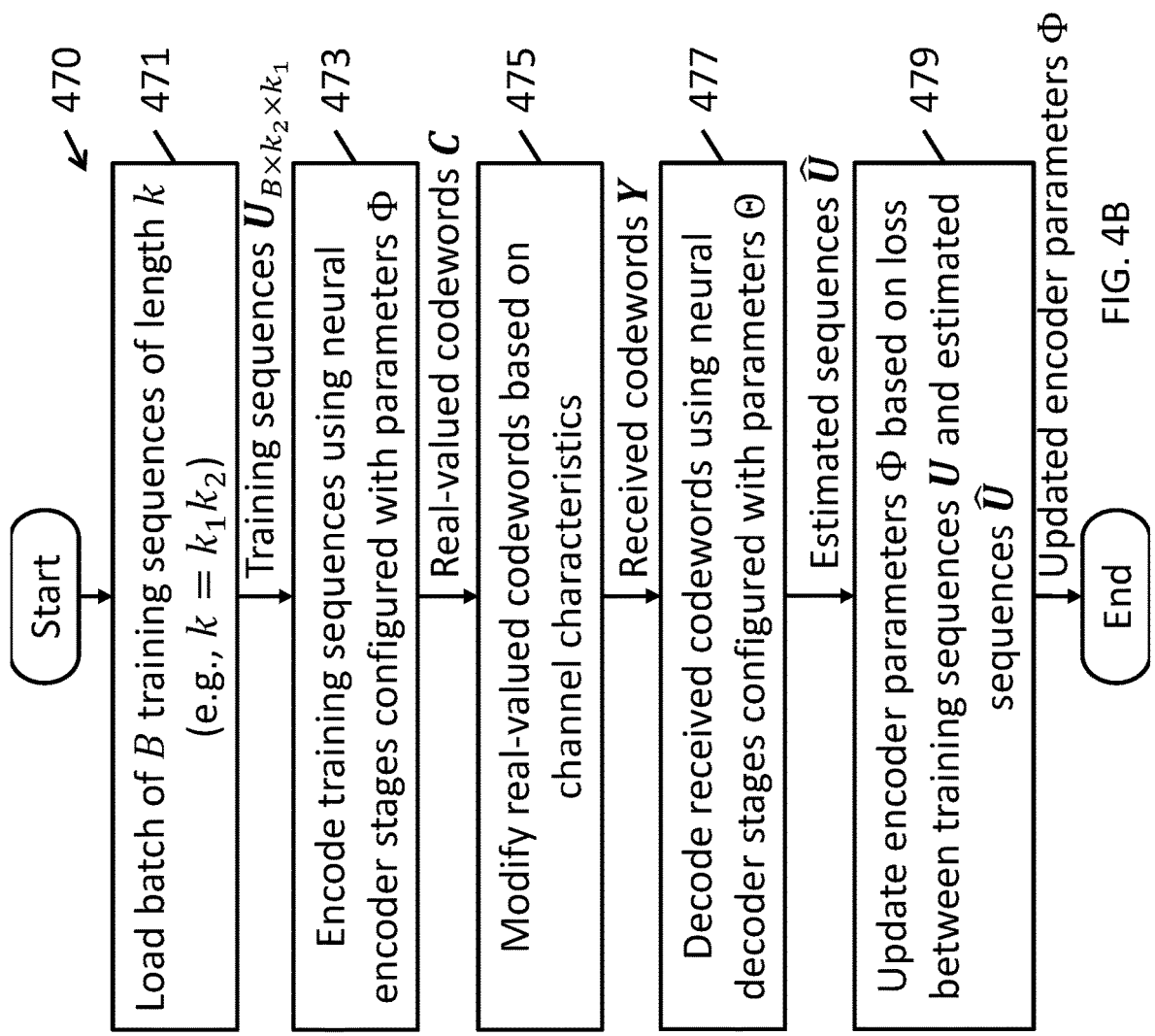
FIG. 4B is a flowchart of a method for training a neural product encoder during a neural encoder training epoch according to one embodiment of the present disclosure.

FIG. 4B is a flowchart of a method 470 for training a neural product encoder during a neural encoder training epoch according to one embodiment of the present disclosure. This method 470 may be used to implement the training of parameters for neural encoder stages at 395 of method 390 shown in FIG. 3D. At 471, the training system loads a batch of B length-k binary information sequences (e.g., where $k=k_1 k_2$ in the case of a two-dimensional product code), which is shaped to a tensor $U_{B \times k_2 \times k_1}$ to fit the input shapes of the neural encoders. The batch of B sequences may be generated randomly (e.g., using a pseudorandom number generator). At 473, the training system encodes the input batch of sequences by supplying them to the first neural encoder stage 411 and the second neural encoder stage 412 of the neural encoder 410 configured based on encoder parameters Φ, and simulates transmitting the real-valued codewords C through a channel 450 by applying distortions and/or noise, such as additive white Gaussian noise (AWGN), to produce the received codewords Y. At 477, the training system decodes the received codewords Y by supplying them to a neural decoder 420 configured with corresponding decoder parameters Θ (where these decoder parameters are kept fixed throughout the encoder training schedule) to compute decoded codewords or estimated codewords $\hat{U}_{B \times k_2 k_1}$ (after appropriate reshaping). At 479, by computing the loss $\mathcal{L}$ between the training sequences (the transmitted sequences) U and the estimated sequences U ( $\mathcal{L}$ (U, U) using loss calculator 461) and backpropagating the loss to compute its gradients (through backpropagator 463), the encoder optimization takes a step to update the weights of the NN encoders (using optimizer 465) to compute updated encoder weights $\phi_1$ and $\phi_2$. These updated encoder weights $\phi_1$ and $\phi_2$ are used to reconfigure the first neural encoder stage 411 and the second neural encoder stage 412. This procedure will be repeated $T_{enc}$ times to update the encoder weights $\phi_1$ and $\phi_2$ during each iteration, while keeping the decoder weights Θ fixed (for a fixed neural decoder 420).

Figure 5A:
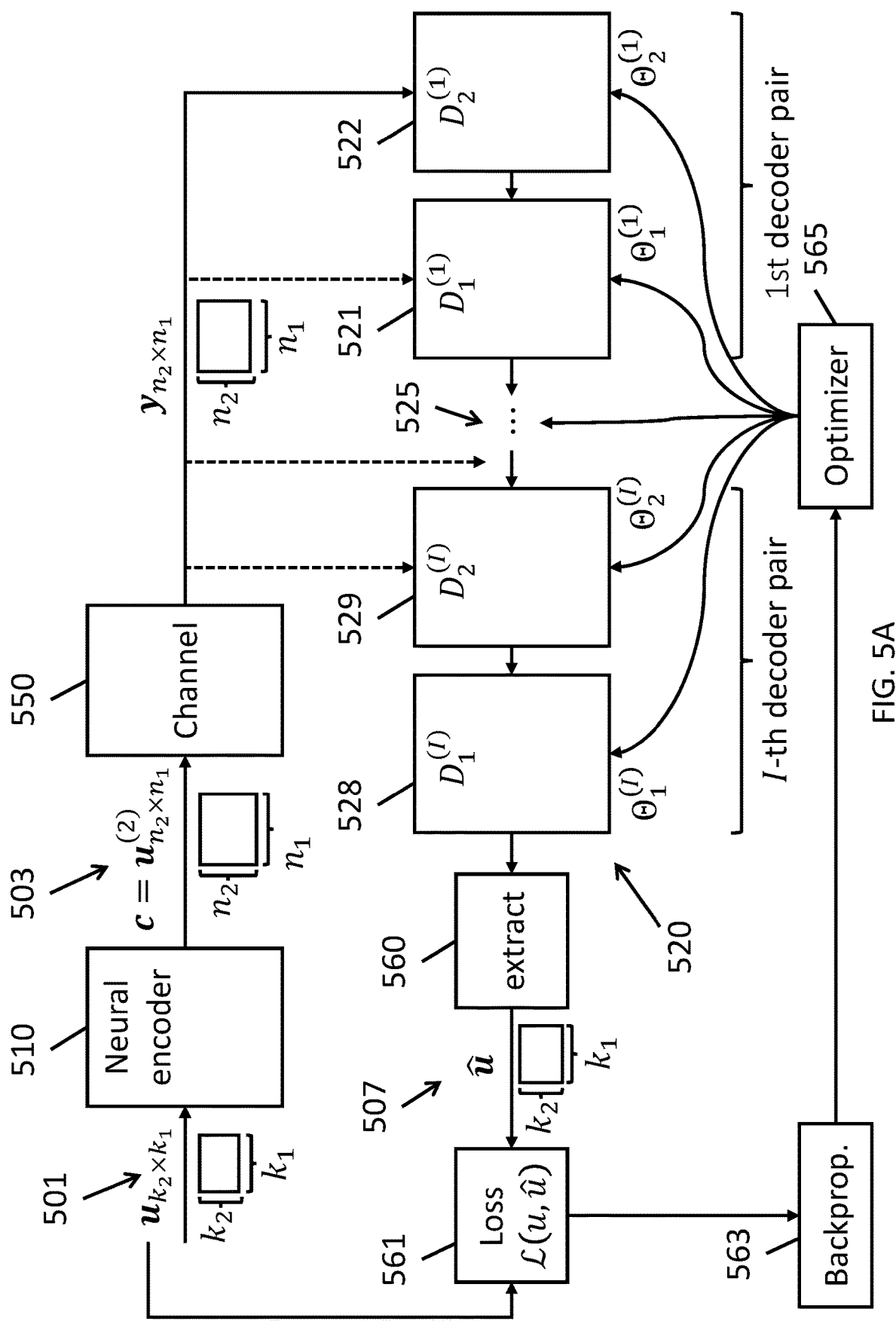
FIG. 5A is a schematic depiction of a neural decoder training schedule of a joint training process for training a neural product encoder and a neural product decoder pair according to one embodiment of the present disclosure.

FIG. 5A is a schematic depiction of a neural decoder training schedule of a joint training process for training a neural product encoder and a neural product decoder pair according to one embodiment of the present disclosure.

As shown above in FIG. 3 and in FIG. 5A, in some embodiments the pair of decoders (or M decoders) at each i-th iteration through the neural product decoder 320 (i=1, . . . , I) is replaced with a pair of distinct FCNNs (or M distinct FCNNs in the case where M>2), resulting in 2I or M×I neural decoder stages $D_j^{(i)}$, j=1, 2 (or M×I neural decoder stages $D_j^{(i)}$, j=1, . . . , M), each configured by a corresponding set of parameters $\Theta_j^{(i)}$ (e.g., weights and biases). The M neural decoder stages corresponding to an i-th iteration may be referred to as an i-th sub-sequence or an i-th group of the M×I. In some embodiments, the first I−1 pairs of NN decoders work on input and output sizes of the length of coded bits $n_j$, while the last pair of decoders reverts the encoding operation by reducing the lengths from $n_j$ to $k_j$. Also, in some embodiments, some of the decoders take multiple length-$n_j$ vectors as input and output multiple copies of length-$n_j$ vectors, as discussed in more detail below.

Figure 5B:
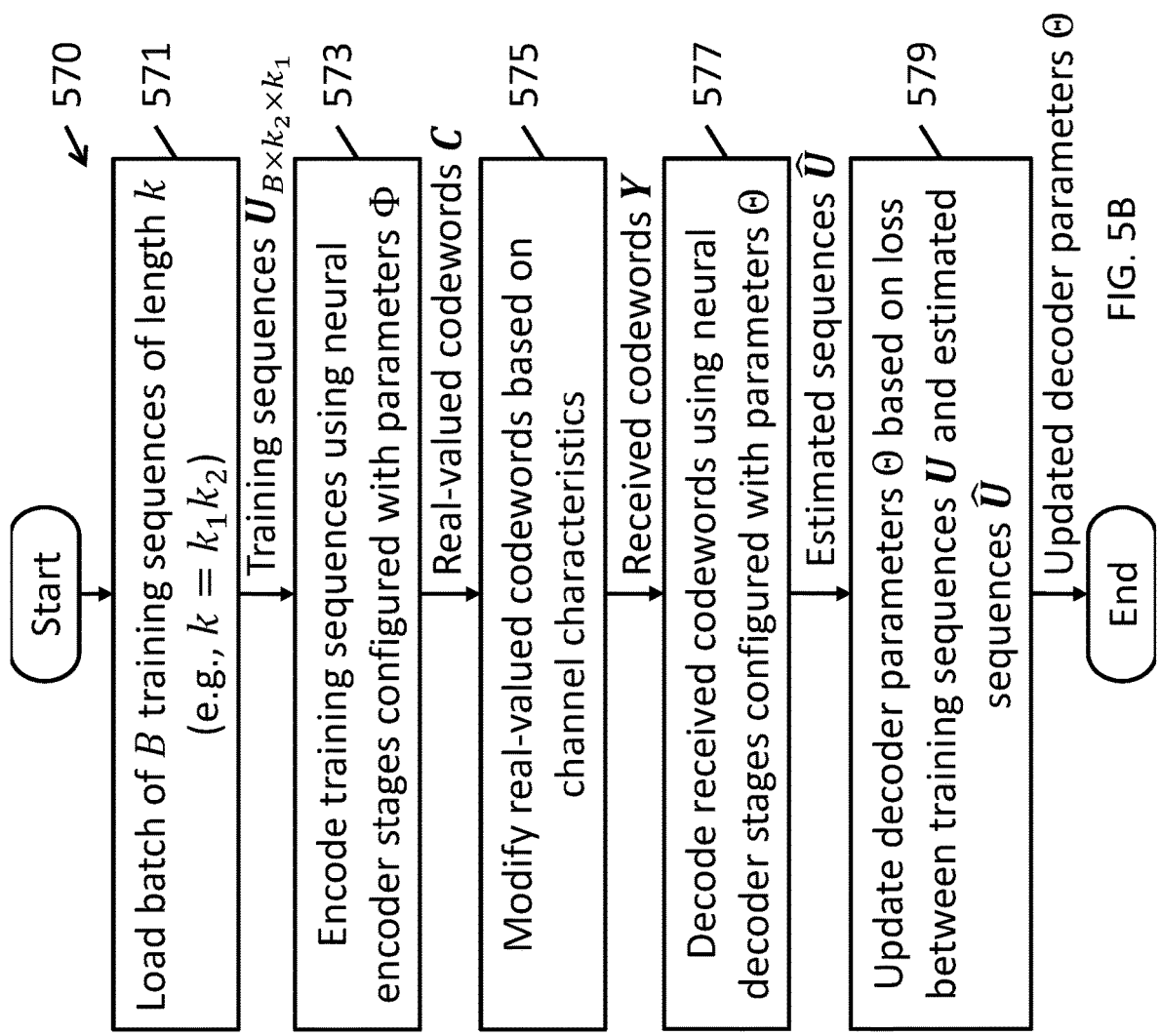
FIG. 5B is a flowchart of a method for training a neural product decoder during a neural decoder training epoch according to one embodiment of the present disclosure.

FIG. 5B is a flowchart of a method 570 for training a neural product decoder during a neural decoder training epoch according to one embodiment of the present disclosure. This method 570 may be used to implement the training of parameters for neural decoder stages at 393 of method 390 shown in FIG. 3D.

At 571, the training system loads a batch of B binary information sequences of length k (e.g., where $k=k_1 k_2$ in the case where M=2) and shaped in accordance with $U_{B \times k_2 \times k_1}$. At 573, the training system supplies the training sequences U to a neural encoder 510 configured with parameters Φ that remain fixed during the decoder training epoch. The real-valued codewords C will be passed through a model of the channel 550, which simulates transmitting the real-valued codewords C through the channel 550 by applying distortions and/or noise, such as additive white Gaussian noise (AWGN), to produce the received codewords Y. In some embodiments, the distortion, such as AWGN is applied through a selected (range of) decoder training SNR, as discussed in more detail below. The resulting received codewords are then supplied to the neural decoder 520 at 577 to compute a batch of estimated sequences or decoded codewords $\hat{U}_{B \times k_2 k_1}$. After computing the loss ($\mathcal{L}$ (U, U) based on differences between the training sequences U and the estimated sequences Û) and its gradients, the decoder optimizer then computes, at 579, updated decoder parameters Θ for the neural decoder stages. This procedure is repeated $T_{dec}$ times while each time only updating the decoder weights Θ while keeping the encoder parameters Φ for the neural encoder 510 fixed.

In some embodiments, the neural encoder is trained with the channel being modeled as applying AWGN with a single SNR of γ dB and where the decoder is trained with a range of training SNR values where, during each decoding training batch, B random values are chosen uniformly from within the range of training SNR values and assigned to corresponding training codewords. In some embodiments, the decoder is trained with a range of SNR values from γ−2.5 dB to γ+1 dB. In some embodiments, the training is performed with γ=3 dB.

The embodiment depicted in FIG. 5A further shows dotted lines from the shows that the received codeword y is supplied as input not only to the second neural decoder stage of the first decoder pair of the neural decoder 520, but also to every neural decoder stage (other than the last neural decoder stage of the I-th decoder pair.

In more detail, in some embodiments, the first NN decoder $D_2^{(1)}$, which is the decoder of code $C_2$ in the first iteration, only takes the channel output y of size $n_1 \times n_2$. It then outputs $n_1$ length-$n_2$ vectors formed in a matrix $\tilde{y}_2^{(1)}$. All the next 2I−2 decoders $D_1^{(1)}, D_2^{(2)}, \ldots,$ and $D_2^{(I)}$ take the channel output y in addition to the output of the previous decoder. The last decoder $D_1^{(I)}$ only takes the output of the previous decoder as the input. Some embodiments further include an additional neural decoder stage (as another FCNN) that maps each of $n_1$ length-$n_2$ vectors of the channel output to a length-$k_2$ vector such that they can be concatenated with the $k_2$ length-$n_1$ vectors of the previous NN decoder to form the $k_2$ length-$2n_1$ vectors at the input of the last decoder.

In some embodiments, only the difference of the channel output and the input of the decoder is given to the next decoder. In these embodiments, the first decoder $D_2^{(1)}$ only takes the channel output, the second decoder $D_1^{(1)}$ takes the output of the previous decoder $D_2^{(1)}$, and the next 2I-3 decoders take the difference of the soft information (e.g., the differences between the real-valued outputs of previous decoders). The last decoder $D_1^{(I)}$ takes the output of the previous decoder $D_2^{(I)}$ given the dimensionality issue in subtraction.

Figure 5C:
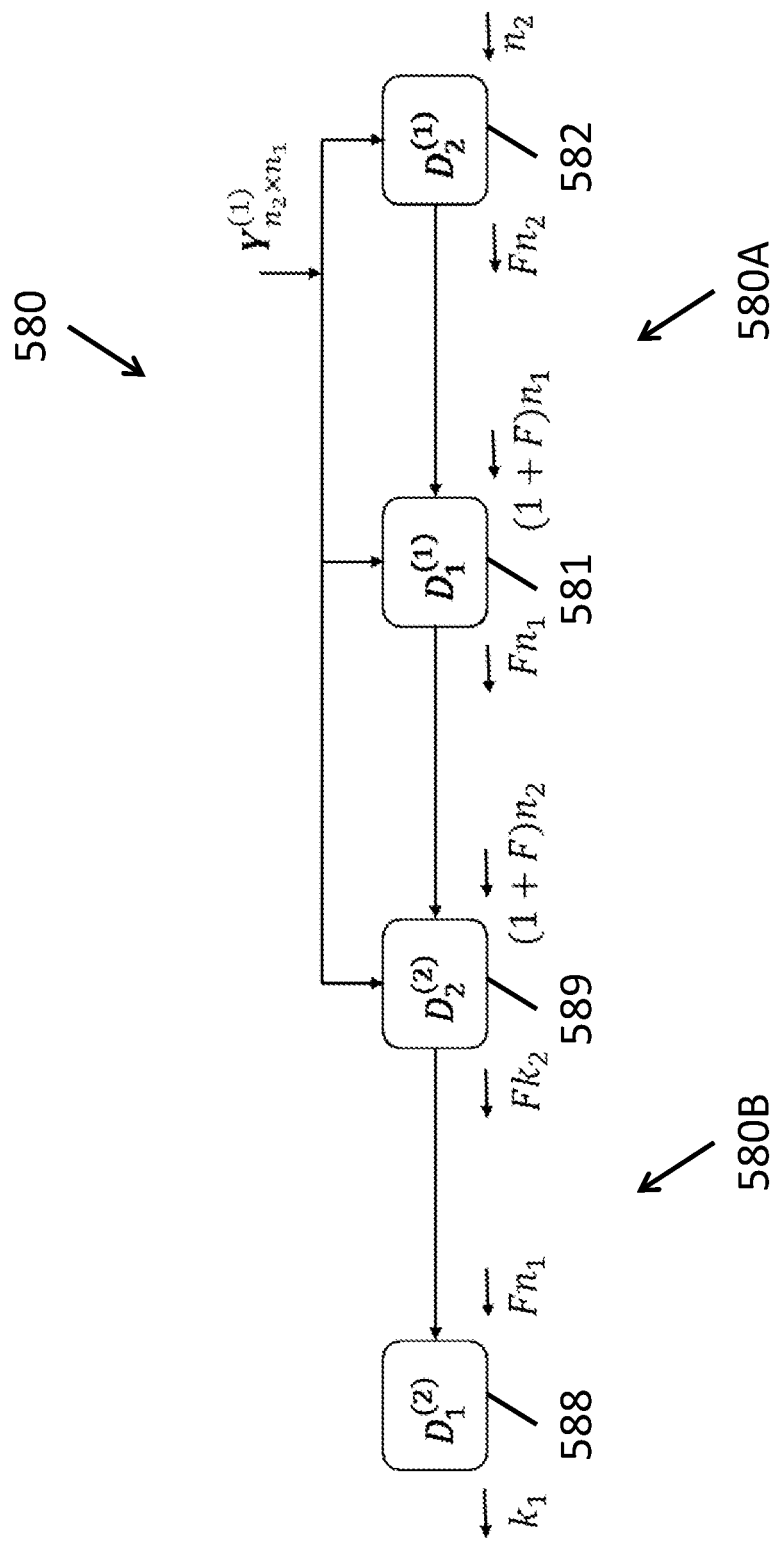
FIG. 5C is an illustration of adding feature size to a neural product code decoder with I=2 decoding iterations.

In some embodiments, each neural decoder (except the last) outputs F vectors instead of one vector, as the soft information (e.g., as the real-valued output of the stage, which may represent probabilities or confidences that particular bits have a value of 1). For example, in some embodiments, a j-th neural decoder stage generates $Fn_j$ outputs, such as by configuring the neural network to produce $Fn_j$ outputs (e.g., by having an output layer or final layer with $Fn_j$ neurons, in the case of a FCNN). These $Fn_j$ outputs can be thought of as F vectors each having length $n_j$ (e.g., an $F \times n_j$ matrix). FIG. 5C is an illustration of adding feature size to a neural product code decoder with I=2 decoding iterations or pipeline stages. As seen in FIG. 5C, decoder output $Y_{n_2 \times n_1}^{(1)}$ is supplied as inputs to the first stage $D_1^{(1)}$ 581 and the second stage $D_2^{(1)}$ 582 of a first pipeline stage 580A and the second stage $D_2^{(2)}$ 589 of a second pipeline stage 580B of a neural decoder 580, where the decoder output $Y_{n_2 \times n_1}^{(1)}$ is concatenated with the output of the previous stage (if any) to provide the input to the following stage. As an example, the input to the first stage $D_1^{(1)}$ of the first pipeline stage takes the channel output $Y_{n_2 \times n_1}^{(1)}$, which has a size $n_2 * n_1$. This is equivalent to having $n_2$ vectors of size $n_1$ that need to be decoded by the first stage $D_1^{(1)}$. Additionally, the output of the second stage $D_2^{(1)}$ of the first pipeline stage is provided to the first stage $D_1^{(1)}$ and has a size $Fn_2 \times n_1$ which is first reshaped to an array of shape $n_2 \times Fn_1$ before concatenating this with the channel output $Y_{n_2 \times n_1}^{(1)}$ to form an array of shape $n_2 \times (n_1 + Fn_1)$, which is equivalent to $n_2$ vectors of size $n_1 + Fn_1 = (F+1)n_1$ (at the input of the first stage $D_1^{(1)}$ that each are decoded via the first stage $D_1^{(1)}$ to output $n_2$ vectors of size $Fn_1$. As such, the input and output sizes of the first stage $D_1^{(1)}$ of the first pipeline stage are $(1+F)n_1$ and $Fn_1$, respectively, as shown in FIG. 5C. Further downstream stages of the neural decoder 580 shown in FIG. 5C follow a similar relationship between their input sizes and output sizes.

While some specific embodiments of the present disclosure are described above where the neural encoders and the neural decoders are implemented using fully connected neural networks (FCNNs), embodiments of the present disclosure are not limited thereto and the neural networks included in the neural encoder stages and neural decoder stages may have different neural architectures, such as a convolutional neural network (CNN) architecture, a recurrent neural network (RNN) architecture, or a transformer neural network architecture.

In some embodiments of the present disclosure, the optimizer 465 and optimizer 565 are implemented using the Adam optimizer (see, e.g., Kingma, Diederik P., and Jimmy Ba. "Adam: A method for stochastic optimization." arXiv preprint arXiv: 1412.6980 (2014).) In some embodiments, the scale exponential linear unit (SELU) activation function is used as the activation function to the hidden layers of the FCNNs. In some embodiments, the loss function $\mathcal{L}$ implemented by the loss computer 461 and 561 uses the BCE with Logits Loss function, which combines a sigmoid layer with a binary cross-entropy loss. However, embodiments of the present disclosure are not limited to training neural encoders and neural decoders using these approaches and other optimizers, other activation functions, and other loss functions may be used in the training schedules of the neural encoder and the training schedule of the neural decoder.

Accordingly, aspects of embodiments of the present disclosure relate to a neural product encoder and a neural product decoder and methods for jointly training the neural product encoder and the neural product decoder to train a neural product coding system.

In experimental testing, embodiments of the present disclosure implementing a $(15,10)^2$ neural code (e.g., a (255, 100) neural code) outperformed the BER of the equivalent polar code (obtained by puncturing 31 coded bits of a (256,100) polar code at random) by a large margin over all ranges of SNR, while maintaining approximately the same BLER as the polar code.

In additional experimental tests, a neural product autoencoder implementing a $(21,14)^2$ neural code (e.g., a (441,196) code) according to one embodiment of the present disclosure outperformed a polar code with the same length under SC decoding. The polar code was obtained by puncturing 71 coded bits of a (512,196) polar code at random. The moderate-length $(21,14)^2$ neural code outperformed the BER of the equivalent polar code by a large margin over all ranges of SNR, while maintaining approximately the same BLER performance.

In some experimental tests, embodiments of the present disclosure were compared against a polar under CRC-List-SC decoder, LDPC, and a tail-biting convolutional code (TBCC). All three of these classical codes have parameters (300,100). A $(15,10)^2$ neural code according to the present disclosure outperformed TBCC with a good margin over all ranges of $E_b/N_0$ and that of polar and LDPC codes for BER values of larger than $10^{-4}$. A fair comparison requires reducing the blocklength of the considered classical codes to 225 bits, e.g., through puncturing 75 bits. In addition, a $(21,14)^2$ neural code according to embodiments of the present disclosure, with less than 1.5 times larger blocklength but almost twice larger code dimension, is able to outperform the state-of-the-art classical codes, with a good margin, over all BER ranges of interest.

It should be understood that the sequence of steps of the processes described herein in regard to various methods and with respect various flowcharts is not fixed, but can be modified, changed in order, performed differently, performed sequentially, concurrently, or simultaneously, or altered into any desired order consistent with dependencies between steps of the processes, as recognized by a person of skill in the art. Further, as used herein and in the claims, the phrase "at least one of element A, element B, or element C" is intended to convey any of: element A; element B; element C; elements A and B; elements A and C; elements B and C; and elements A, B, and C.

Embodiments of the present invention can be implemented in a variety of ways as would be appreciated by a person of ordinary skill in the art, and the term "processor" as used herein may refer to any computing device capable of performing the described operations, such as a programmed general purpose processor (e.g., an ARM processor) with instructions stored in memory connected to the general purpose processor, a field programmable gate array (FPGA), and a custom application specific integrated circuit (ASIC). Embodiments of the present invention can be integrated into a serial communications controller (e.g., a universal serial bus or USB controller), a graphical processing unit (GPU), an intra-panel interface, and other hardware or software systems configured to transmit and receive digital data.

While the present invention has been described in connection with certain example embodiments, it is to be understood that the invention is not limited to the disclosed embodiments, but, on the contrary, is intended to cover various modifications and equivalent arrangements included within the spirit and scope of the appended claims.

What is claimed is:

1. A processing circuit comprising:
   a transmitter device; and
   an encoder for an (n,k) error correction code, the encoder being configured to:
      receive k symbols of original data;
      supply the k symbols of original data to a neural product encoder comprising a plurality of M neural encoder stages, a j-th neural encoder stage of the plurality of M neural encoder stages comprising a j-th neural network configured by a j-th plurality of parameters to implement an $(n_j,k_j)$ error correction code, where $n_j$ is a factor of n and $k_j$ is a factor of k, and where the j-th neural network comprises a hidden layer comprising $N_{encj}$ neurons, where $N_{encj}$ is greater than $n_j$ and greater than $k_j$; and
      output, to the transmitter device, n symbols of encoded data representing the k symbols of original data encoded by the (n,k) error correction code,
   wherein the transmitter device transmits a communication signal comprising the n symbols of encoded data to a receiver device over a communication channel in response to receiving the n symbols of encoded data from the encoder.

2. The processing circuit of claim 1, wherein the j-th neural network comprises a fully connected neural network, and
   wherein the j-th plurality of parameters comprise a plurality of weights of connections between neurons of the fully connected neural network.

3. The processing circuit of claim 1, wherein the encoder is further configured to reshape the k symbols of original data into a M-dimensional original data, and
   wherein the j-th neural encoder stage is configured to encode a j-th dimension of $k_j$ symbols of the M-dimensional original data.

4. The processing circuit of claim 1, wherein the j-th neural network is configured to output a real-valued vector having length $n_j$.

5. The processing circuit of claim 1, wherein the processing circuit is integrated into a mobile device, and
   wherein the processing circuit is configured to encode the original data for transmission in accordance with a cellular communication protocol.

6. A method comprising
   receiving k symbols of original data;
   suppling the k symbols of original data to a neural product encoder comprising a plurality of M neural encoder stages, a j-th neural encoder stage of the plurality of M neural encoder stages comprising a j-th neural network configured by a j-th plurality of parameters to implement an $(n_j,k_j)$ error correction code, where $n_j$ is a factor of n and $k_j$ is a factor of k, and where the j-th neural network comprises a hidden layer comprising $N_{encj}$ neurons, where $N_{encj}$ is greater than $n_j$ and greater than $k_j$;
   transmitting, to a communication channel, a communication signal comprising n symbols of encoded data representing the k symbols of original data encoded by an (n,k) error correction code.

7. The method of claim 6, wherein the j-th neural network comprises a fully connected neural network, and
   wherein the j-th plurality of parameters comprise a plurality of weights of connections between neurons of the fully connected neural network.

8. The method of claim 6, further comprising reshaping the k symbols of original data into a M-dimensional original data, and
   wherein the j-th neural encoder stage is configured to encode a j-th dimension of $k_j$ symbols of the M-dimensional original data.

9. The method of claim 6, wherein the j-th neural network is configured to output a real-valued vector having length $n_j$.

10. The method of claim 6, wherein the processing circuit is integrated into a mobile device, and
    wherein the processing circuit is configured to encode the original data for transmission in accordance with a cellular communication protocol.

11. A non-transitory computer-readable medium storing instructions that, when executed by a processing circuit, cause the processing circuit to:
    receive k symbols of original data;
    supply the k symbols of original data to a neural product encoder comprising a plurality of M neural encoder stages, a j-th neural encoder stage of the plurality of M neural encoder stages comprising a j-th neural network configured by a j-th plurality of parameters to implement an $(n_j,k_j)$ error correction code, where $n_j$ is a factor of n and $k_j$ is a factor of k, and where the j-th neural network comprises a hidden layer comprising $N_{encj}$ neurons, where $N_{encj}$ is greater than $n_j$ and greater than $k_j$;
    supply n symbols of encoded data representing the k symbols of original data encoded by the (n,k) error correction code to a transmitter device; and
    transmit, using the transmitter device, a communication signal comprising the n symbols of encoded data to a receiver device over a communication channel.

12. The non-transitory computer-readable medium of claim 11, wherein the j-th neural network comprises a fully connected neural network, and
    wherein the j-th plurality of parameters comprise a plurality of weights of connections between neurons of the fully connected neural network.

13. The non-transitory computer-readable medium of claim 11, further storing instructions that, when executed by the processing circuit, cause the processing circuit to reshape the k symbols of original data into a M-dimensional original data, and
    wherein the j-th neural encoder stage is configured to encode a j-th dimension of $k_j$ symbols of the M-dimensional original data.

14. The non-transitory computer-readable medium of claim 11, wherein the j-th neural network is configured to output a real-valued vector having length $n_j$.

15. The non-transitory computer-readable medium of claim 11, wherein the processing circuit is integrated into a mobile device, and wherein the processing circuit is configured to encode the original data for transmission in accordance with a cellular communication protocol.

* * * * *